(12) United States Patent
Chiu et al.

(10) Patent No.: US 11,973,043 B2
(45) Date of Patent: *Apr. 30, 2024

(54) MULTIPLE CONDUCTIVE POSTS

(71) Applicant: SILICONWARE PRECISION INDUSTRIES CO., LTD., Taichung (TW)

(72) Inventors: Chih-Hsien Chiu, Taichung (TW); Wen-Jung Tsai, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/103,196

(22) Filed: Jan. 30, 2023

(65) Prior Publication Data

US 2023/0245986 A1 Aug. 3, 2023

Related U.S. Application Data

(60) Continuation of application No. 17/518,146, filed on Nov. 3, 2021, now Pat. No. 11,594,501, which is a
(Continued)

(30) Foreign Application Priority Data

Apr. 9, 2020 (TW) ................................. 109111986

(51) Int. Cl.
*H01L 23/552* (2006.01)
*H01L 21/56* (2006.01)
(Continued)

(52) U.S. Cl.
CPC .............. *H01L 23/66* (2013.01); *H01L 21/56* (2013.01); *H01L 23/3121* (2013.01);
(Continued)

(58) Field of Classification Search
CPC ....... H01L 23/66; H01L 21/56; H01L 23/552; H01L 23/3121; H01L 23/49838;
(Continued)

(56) References Cited

U.S. PATENT DOCUMENTS 11,195,808 B2 * 12/2021 Chiu ..................... H01L 23/552
2008/0303724 A1 12/2008 Hsieh
(Continued)

*Primary Examiner* — Didarul A Mazumder
(74) *Attorney, Agent, or Firm* — Kelly & Kelley, LLP

(57) ABSTRACT

An electronic package is formed by disposing an electronic element and a lead frame having a plurality of conductive posts on a carrier structure having an antenna function, and encapsulating the electronic element and the lead frame with an encapsulant. The encapsulant is defined with a first encapsulating portion and a second encapsulating portion lower than the first encapsulating portion. The electronic element is positioned in the first encapsulating portion, and the plurality of conductive posts are positioned in the second encapsulating portion. End surfaces of the plurality of conductive posts are exposed from a surface of the second encapsulating portion so as to be electrically connected to a connector.

13 Claims, 11 Drawing Sheets

Related U.S. Application Data division of application No. 16/878,250, filed on May 19, 2020, now Pat. No. 11,195,808.

(51) Int. Cl.
- *H01L 23/31* (2006.01)
- *H01L 23/498* (2006.01)
- *H01L 23/66* (2006.01)
- *H01L 23/00* (2006.01)

(52) U.S. Cl.
CPC .. *H01L 23/49838* (2013.01); *H01L 23/49861* (2013.01); *H01L 23/552* (2013.01); *H01L 23/49833* (2013.01); *H01L 24/16* (2013.01); *H01L 2223/6677* (2013.01); *H01L 2224/16225* (2013.01); *H01L 2924/3025* (2013.01)

(58) Field of Classification Search
CPC ....... H01L 23/49861; H01L 2223/6677; H01L 2924/3025; H01L 23/49833; H01L 24/16; H01L 2224/16225
USPC .......................................................... 257/659
See application file for complete search history.

(56) References Cited

U.S. PATENT DOCUMENTS

| | | |
|---|---|---|
| 2010/0289126 A1 | 11/2010 | Pagaila |
| 2018/0026341 A1 | 1/2018 | Mow |
| 2019/0304926 A1 | 10/2019 | Ryu |

* cited by examiner

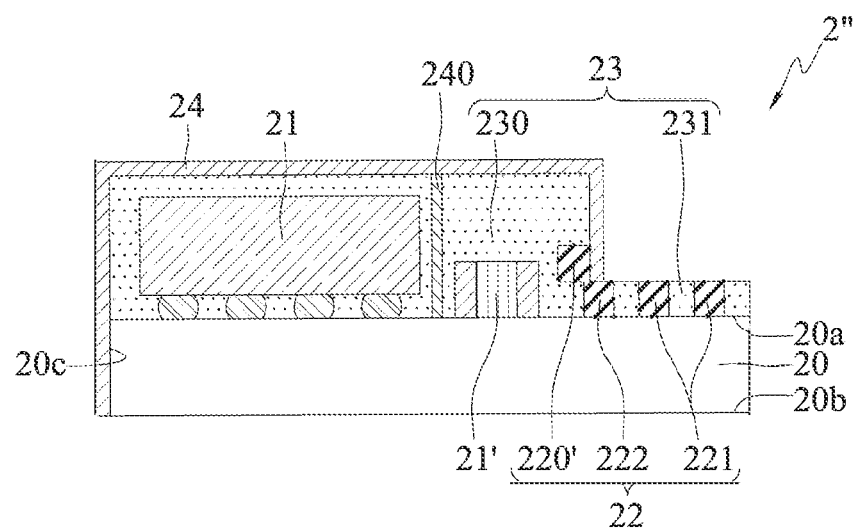
FIG. 2D"

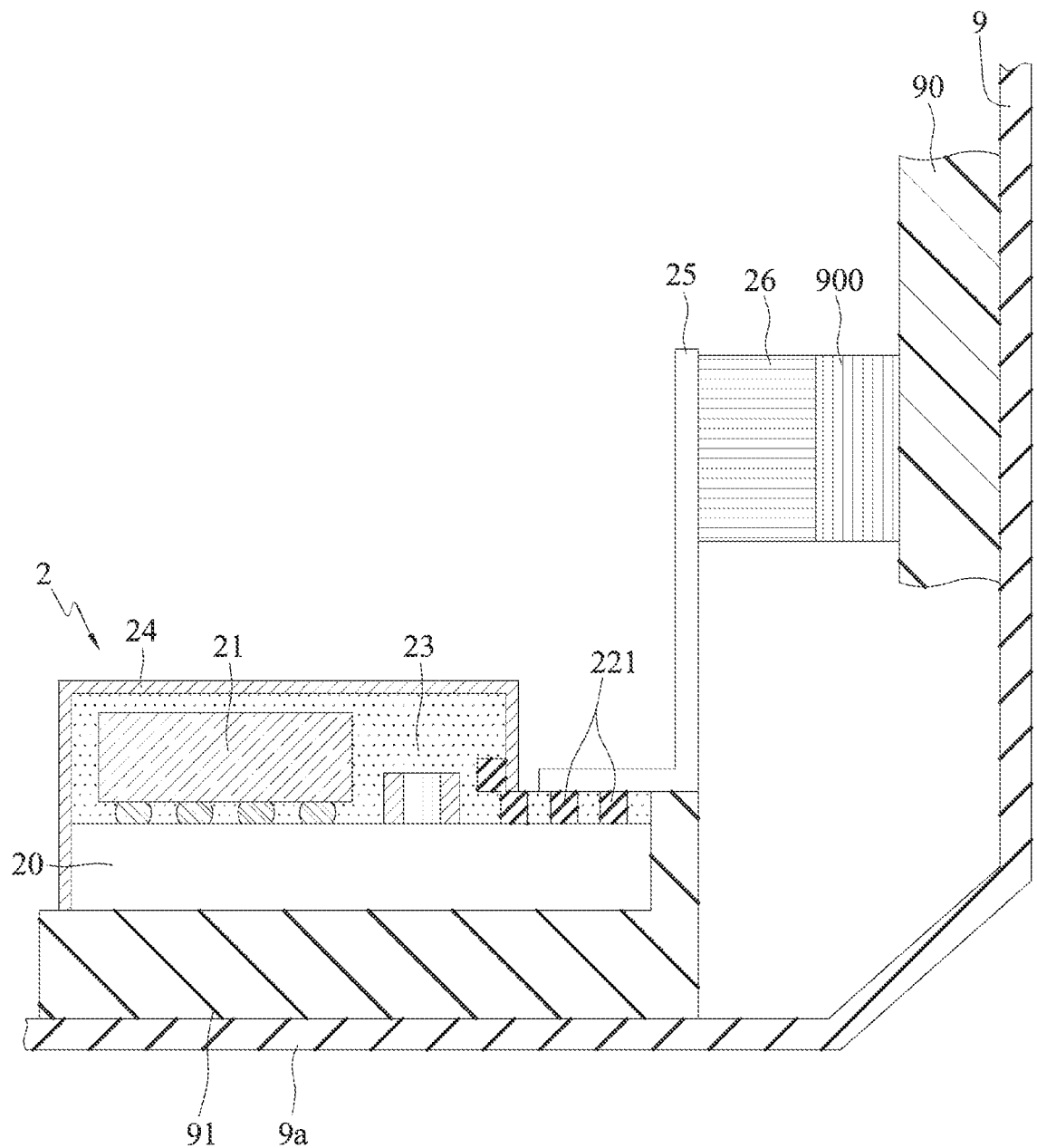
FIG. 2E"

MULTIPLE CONDUCTIVE POSTS

CROSS-REFERENCE TO RELATED APPLICATIONS

This is a continuation of U.S. Ser. No. 7/518,146, filed Nov. 3, 2021, which is a divisional of U.S. Ser. No. 16/878,250, filed May 18, 2020 (now U.S. Pat. No. 11,195,808). This application claims priority to Taiwan Application Serial No .109111986, filed on Apr. 9, 2020. The entirety of the above-mentioned patent application is hereby incorporated by reference herein and made a part of this specification.

BACKGROUND

1. Technical Field

The present disclosure relates to packaging processes, and more particularly, to an electronic package having an antenna function and a fabrication method thereof.

2. Description of Related Art

Along with the rapid development of electronic industries, electronic products are developed toward the trend of multi-function and high performance. Current fourth generation (4G) wireless communication technologies have been widely applied in various consumer electronic products for facilitating receiving or transmission of various wireless signals.

However, along with the rapid development of wireless communication and increased network resources, the required wireless communication bandwidth becomes larger and larger. Therefore, the research and development of fifth generation (5G) wireless transmission have become a trend.

FIG. 1 is a schematic perspective view of a conventional wireless communication device. As shown in FIG. 1, the wireless communication device 1 comprises: a circuit board 10 with electronic elements 11 disposed thereon, a plurality of chip elements 16 disposed on and electrically connected to the circuit board 10, an antenna element 12 electrically connected to the chip elements 16 through a transmission line 17, and an encapsulant 13 encapsulating the chip elements 16 and a portion of the transmission line 17.

However, in the conventional wireless communication device 1, to enhance signal strength, the antenna element 12 for 5G needs to be disposed near a housing of a portable electronic product. Therefore, the portable electronic product has a limited space available for the antenna element 12 and further the miniaturization requirement of the wireless communication device 1 needs to be met. In addition, how to establish electrical communication between the wireless communication device 1 disposed near the housing and other components (e.g., a mainboard) disposed in the center of the portable electronic product is a problem to be solved.

Therefore, how to overcome the above-described drawbacks of the prior art has become an urgent issue in the art.

SUMMARY

In view of the above-described drawbacks, the present disclosure provides an electronic package, which comprises: a carrier structure having an antenna function; an electronic element disposed on and electrically connected to the carrier structure; a lead frame disposed on the carrier structure and having a plurality of conductive posts separated from one another, wherein the plurality of conductive posts are electrically connected to the carrier structure; and an encapsulant disposed on the carrier structure for encapsulating the electronic element and the lead frame, wherein the encapsulant is defined with a first encapsulating portion and a second encapsulating portion that are integrally formed with one another, wherein the electronic element is positioned in the first encapsulating portion and the plurality of conductive posts are positioned in the second encapsulating portion, wherein a height of the first encapsulating portion is greater than a height of the second encapsulating portion, and wherein end surfaces of the plurality of conductive posts are exposed from a surface of the second encapsulating portion to electrically connect to a connector.

The present disclosure further provides a method for fabricating an electronic package, which comprises: providing a carrier structure having an antenna function; disposing and electrically connecting at least one electronic element and at least one lead frame onto the carrier structure, wherein the lead frame has a plurality of conductive posts separated from one another; and forming an encapsulant on the carrier structure for encapsulating the electronic element and the lead frame, wherein the encapsulant is defined with a first encapsulating portion and a second encapsulating portion that are integrally formed with one another, wherein the electronic element is positioned in the first encapsulating portion and the plurality of conductive posts are positioned in the second encapsulating portion, wherein a height of the first encapsulating portion is greater than a height of the second encapsulating portion, and wherein end surfaces of the plurality of conductive posts are exposed from a surface of the second encapsulating portion to electrically connect to a connector.

In the above-described method, formation of the encapsulant comprises forming an encapsulating material encapsulating the electronic element and the lead frame and then removing a portion of the encapsulating material and a portion of the lead frame to form the encapsulant having the first encapsulating portion and the second encapsulating portion, wherein the end surfaces of the plurality of conductive posts are exposed from the surface of the second encapsulating portion.

In the above-described electronic package and method, the carrier structure comprises a circuit board and an antenna board stacked on one another.

The above-described electronic package and method further comprise covering the electronic element with a shielding structure. For example, the above-described electronic package and method further comprise forming the shielding structure on portions of surfaces of the encapsulant to cover the electronic element and not in contact with the plurality of conductive posts. Further, the lead frame has at least one conductive wall embedded in the encapsulant, wherein the conductive wall is separated from the plurality of conductive posts, exposed from the second encapsulating portion and connected to the shielding structure. Alternatively, the lead frame has at least one conductive block embedded in the encapsulant, wherein the conductive block is separated from the conductive posts, exposed from the first encapsulating portion and connected to the shielding structure.

The above-described electronic package and method further comprise disposing the connector on the plurality of conductive posts.

The above-described electronic package and method further comprise disposing an adapter configured with the connector on the plurality of conductive posts. For example, the adapter is a flexible circuit board.

In the above-described electronic package and method, the second encapsulating portion is disposed on one side of the carrier structure.

In the above-described electronic package and method, the second encapsulating portion is disposed at a corner of the carrier structure.

In the above-described electronic package and method, the encapsulant has a plurality of second encapsulating portions, and the first encapsulating portion is positioned between two of the second encapsulating portions.

In the above-described electronic package and method, the encapsulant has a plurality of first encapsulating portions, and the second encapsulating portion is positioned between two of the first encapsulating portions.

According to the present disclosure, since the first encapsulating portion is higher than the second encapsulating portion and the plurality of conductive posts are exposed from the second encapsulating portion to serve as contacts, the connector can be directly or indirectly integrated into the electronic package as required. As such, the antenna of the carrier structure can be electrically connected to the mainboard of an electronic product with a high degree of freedom through the connector, and the carrier structure can be disposed near the housing of the electronic product according to the requirement of signal strength. Therefore, if the electronic product adopts the electronic package of the present disclosure, there is no space limitation on the design of other components, thus allowing the electronic product to meet all functions as required.

BRIEF DESCRIPTION OF THE DRAWINGS

FIG. 2A' is another aspect of FIG. 2A;

FIG. 2D' is another aspect of FIG. 2D;

FIG. 2D" is another aspect of FIG. 2D';

FIG. 2E" is a schematic cross-sectional view illustrating subsequent application of FIG. 2E;

FIGS. 3D' and 3E' are schematic cross-sectional views illustrating addition of a shielding structure to FIGS. 3D and 3E, respectively;

FIG. 4' is a schematic upper view of FIG. 4.

DETAILED DESCRIPTION

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

FIGS. 2A to 2D are schematic cross-sectional views illustrating a method for fabricating an electronic package 2 according to the present disclosure.

Figure 1:
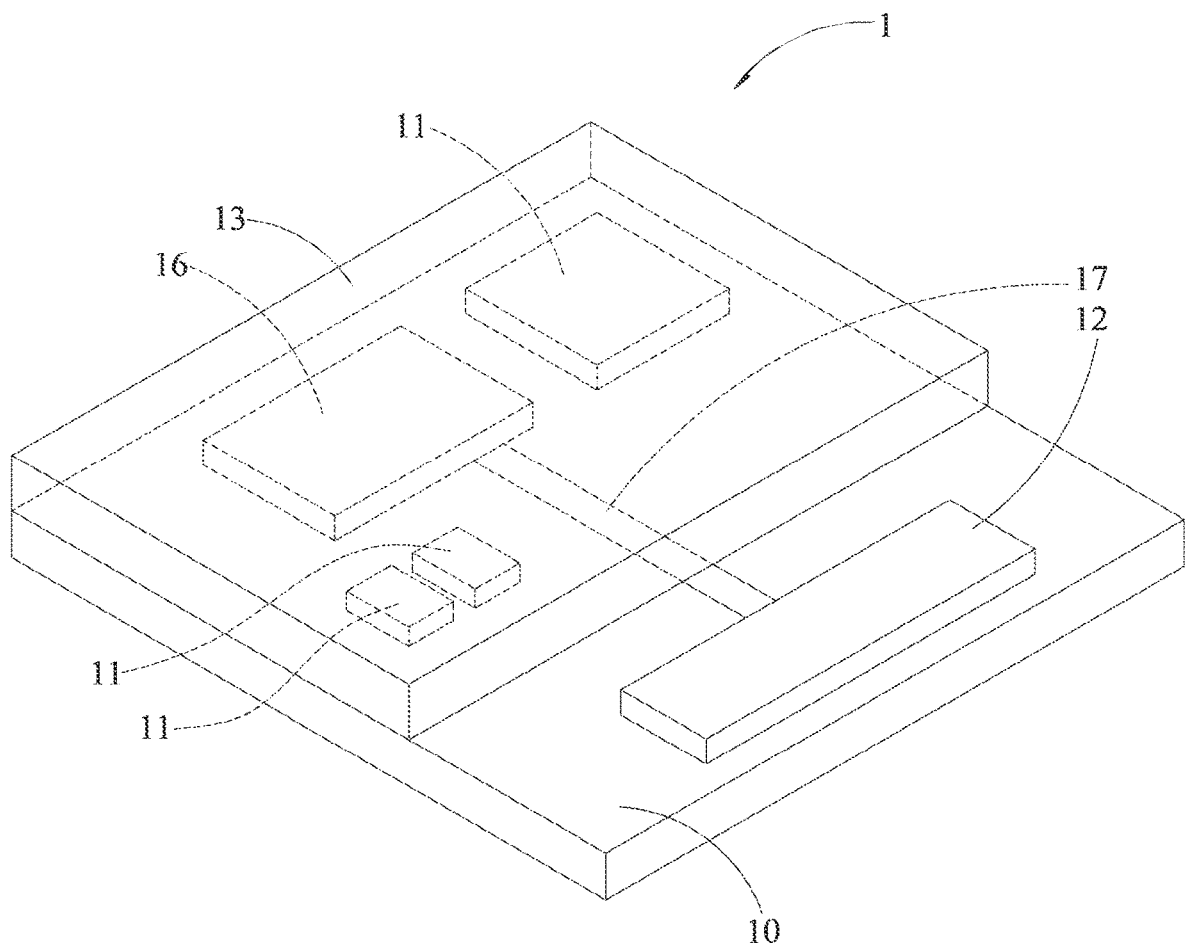
FIG. 1 is a schematic perspective view of a conventional wireless communication device.
Figure 2A:
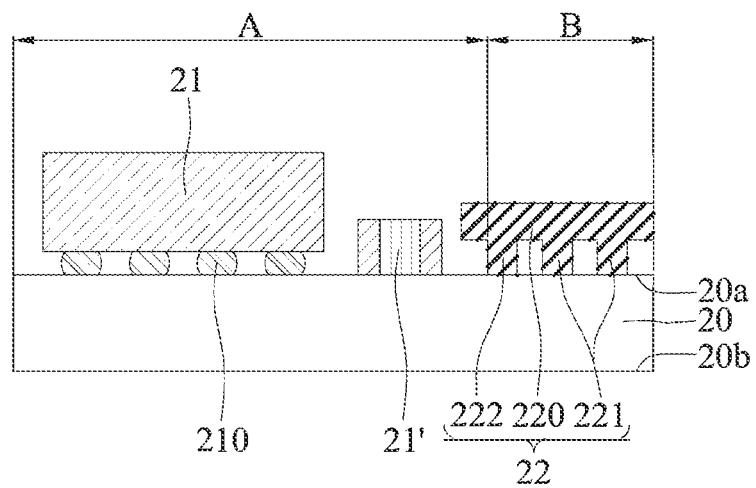
FIGS. 2A to 2D are schematic cross-sectional views illustrating a method for fabricating an electronic package according to the present disclosure.
Figure 2A:
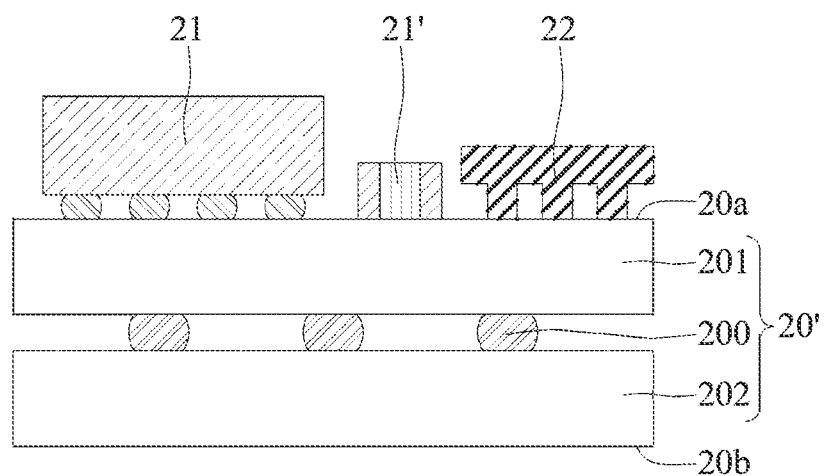

As shown in FIG. 2A, a carrier structure 20 having a first side 20a and a second side opposing the first side 20a, and at least one electronic elements 21, 21' and at least one lead frame 22 are disposed on the first side 20a of the carrier structure 20.

In an embodiment, the carrier structure 20 is a packaging substrate having a core layer of a circuit structure or a coreless circuit structure, which has a plurality of circuit layers such as fan-out redistribution layers (RDLs) formed on a dielectric material. The circuit layers can be made of such as copper, and the dielectric material can be made of such as polybenzoxazole (PBO), polyimide (PI), prepreg (PP) and so on. A first area A and a second area B adjacent to one another are defined on the first side 20a of the carrier structure 20. The first area A serves as an action area for disposing the electronic elements 21, 21' and the second area B serves as an external connection area for disposing the lead frame 22. It should be noted that the carrier structure 20 can be other carrier unit for carrying an electronic element such as a chip. For example, the carrier structure 20 is a lead frame, a silicon interposer, or a functional module and not limited to the above-described examples.

Further, the carrier structure 20 has an antenna function. For example, the carrier structure 20 is an antenna substrate having a circuit layer with an antenna function. Alternatively, as shown in FIG. 2A', the carrier structure 20' can be an antenna module formed by stacking a circuit board 201 and an antenna board 202 on one another. The circuit board 201 is positioned on the first side 20a of the carrier structure 20' and the antenna board 202 is positioned on the second side 20b of the carrier structure 20'. The circuit board 201 can be connected to the antenna board 202 through a plurality of conductors 200 made of such as a solder material.

The electronic elements 21, 21' can be an active element such as a semiconductor chip (e.g., the electronic element 21), a passive element (e.g., the electronic element 21') such as a resistor, a capacitor or an inductor, or a combination thereof. For example, the semiconductor chip is flip-chip disposed on and electrically connected to the circuit layer (not shown) of the first side 20a of the carrier structure 20 through a plurality of conductive bumps 210, and an underfill (not shown) can be formed to encapsulate the conductive bumps 210 as required. The conductive bumps 210 can be made of such as a solder material, metal pillars and so on. In another embodiment, the electronic element 21 can be electrically connected to the circuit layer of the carrier structure 20 through a plurality of bonding wires (not shown) in a wire-bonding manner. In a further embodiment, the electronic element 21' can be in direct contact with the circuit layer of the carrier structure 20. But it should be noted that the manner in which the electronic elements 21, 21' electrically connect the carrier structure 20 is various and not limited to the above-described examples.

Further, the lead frame 22 comprises a plate 220, a conductive wall 222 and a plurality of conductive posts 221 spacingly disposed on the plate 220. The lead frame 22 is vertically disposed on the second area B of the first side 20a of the carrier structure 20 through the conductive posts 221 and the conductive wall 222. For example, the lead frame 22 is formed by removing portions of a metal board such as a copper board through etching, laser or the like.

Figure 2B:
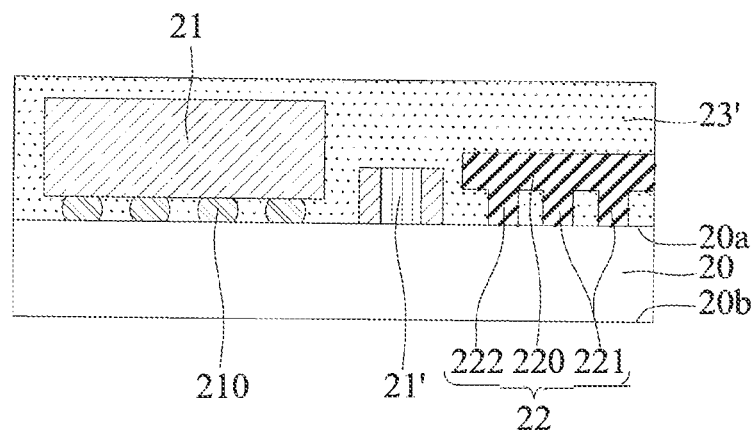

As shown in FIG. 2B, an encapsulating material 23' is formed on the first side 20a of the carrier structure 20 to encapsulate the electronic elements 21, 21' and the lead frame 22.

In an embodiment, the encapsulating material 23' is an insulating material such as polyimide, a dry film, an epoxy resin or a molding compound. For example, the encapsulating material 23' can be formed on the carrier structure 20 by using a liquid compound, injection, lamination or compression molding.

Figure 2C:
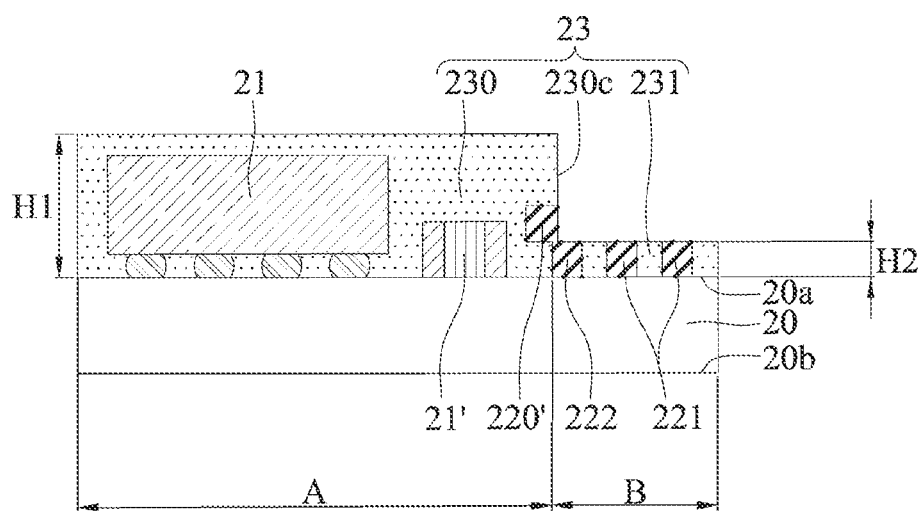

As shown in FIG. 2C, a portion of the encapsulating material 23' and a portion of the plate 220 of the lead frame 22 are removed to form an encapsulant 23 having a notch. The encapsulant 23 is defined with a first encapsulating portion 230 positioned on the first area A and a second encapsulating portion 231 positioned on the second area B. The height H1 of the first encapsulating portion 230 is greater than the height H2 of the second encapsulating portion 231. As such, the conductive posts 221 and the conductive wall 222 are exposed from the second encapsulating portion 231 of the encapsulant 23, and the conductive block 220' (i.e., the remaining portion of the plate 220) is exposed from a side surface 230c of the first encapsulating portion 230. The conductive posts 221 serve as I/O contacts, and the conductive wall 222 and the conductive block 220' are used for grounding. For example, the conductive wall 222 and the conductive block 220' are connected and integrally formed.

In an embodiment, a portion of the plate 220 and a portion of the encapsulating material 23' on the second area B are removed by grinding, and the encapsulating material 23' around the conductive posts 221 and the conductive wall 222 on the second area B are retained as the second encapsulating portion 231. Further, the removal process can be performed by such as etching, laser or milling and is not limited to the above-described examples.

Figure 3A:
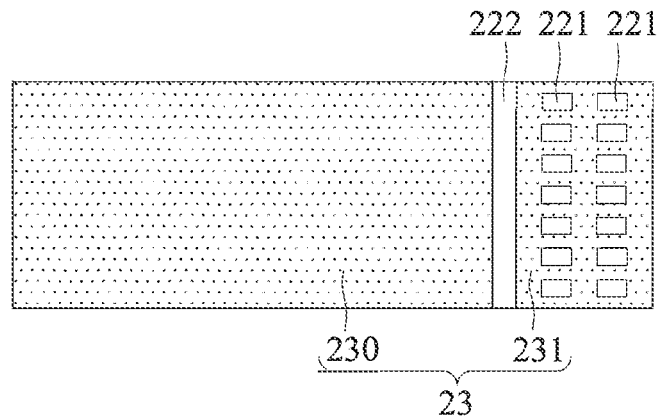
FIGS. 3A to 3C are schematic upper views illustrating various aspects of FIG. 2E.
Figure 3B:
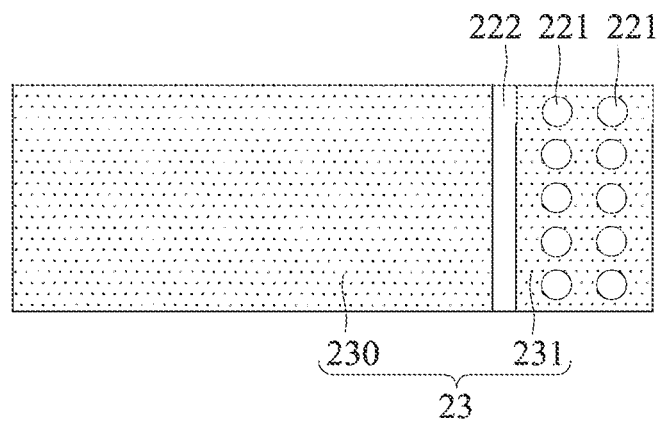

Further, the conductive posts 221 can serve as signal pins, SMT contacts and so on. End surfaces of the conductive posts 221 can have a rectangular shape (as shown in FIG. 3A), a circular shape (as shown in FIG. 3B) and so on.

Figure 3C:
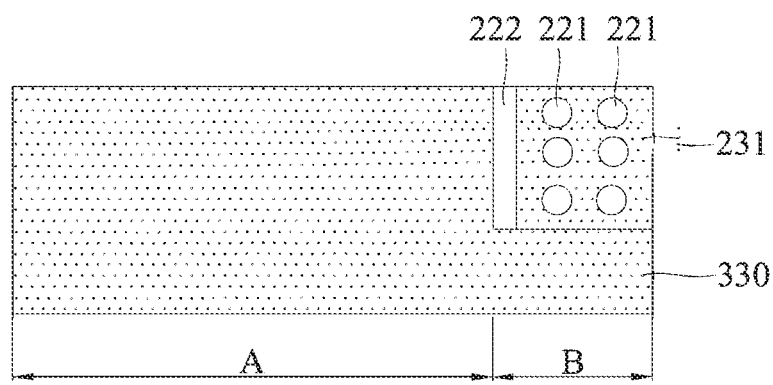
Figure 3D:
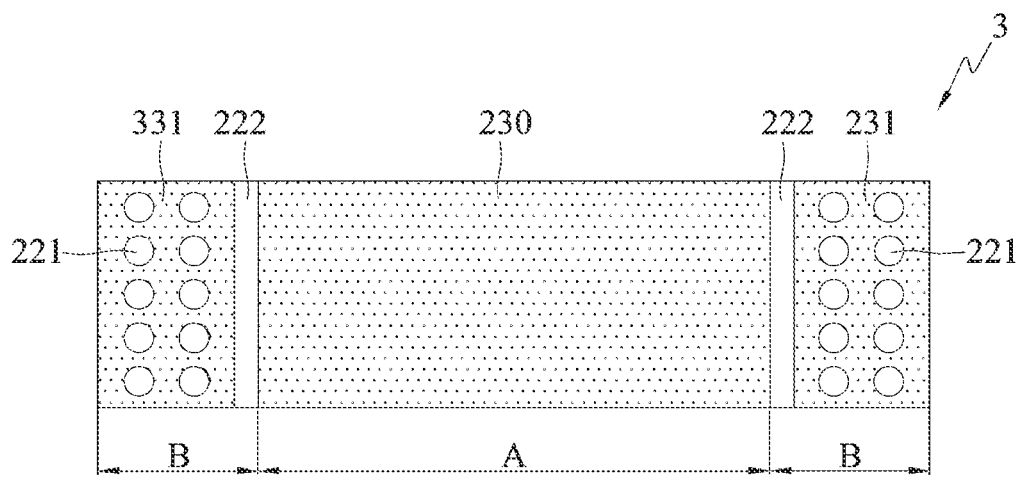
FIGS. 3D and 3E are schematic upper views illustrating other aspects of FIG. 3A.
Figure 3D:
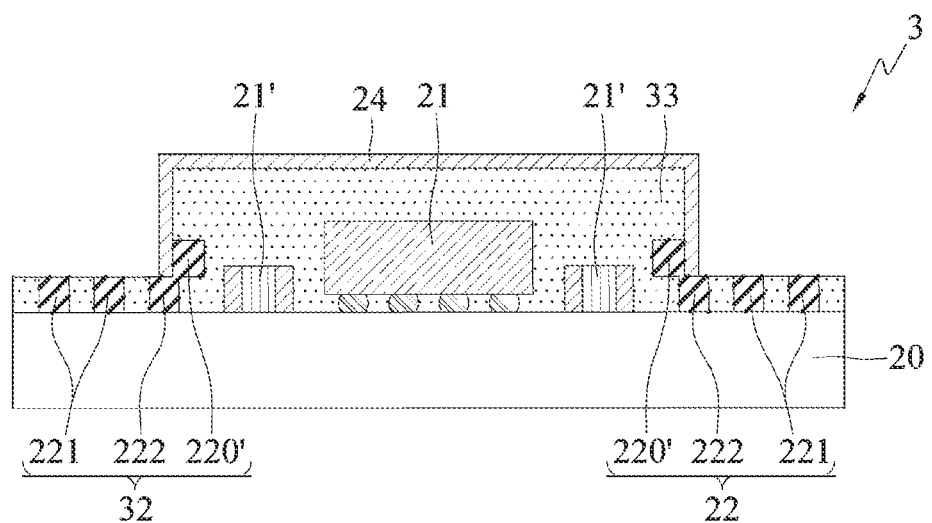

Furthermore, the range of the second encapsulating portion 231 can be adjusted as required. For example, as shown in FIGS. 3A and 3B, the second encapsulating portion 231 covers the entire second area B (i.e., the encapsulant 23 has a stepped shape), or as shown in FIG. 3C, the second encapsulating portion 231 covers a portion of the second area B (i.e., the first encapsulating portion 330 extends to the second area B, that is, the encapsulant 23 has a notched corner), so as to adjust the number of the conductive posts 221 serving as I/O contacts. Further, the number of the lead frame 22 can be increased to adjust the number of the conductive posts 221 serving as I/O contacts. For example, as shown in an electronic package 3 of FIGS. 3D and 3D', two lead frames 22, 32 are disposed at two opposite sides of the electronic elements 21, 21'. That is, two opposite sides of the first area A are defined as second areas B, respectively. As such, the first encapsulating portion 230 is positioned between two second encapsulating portions 231, 331, and the encapsulant 33 has a convex shape.

Figure 3E:
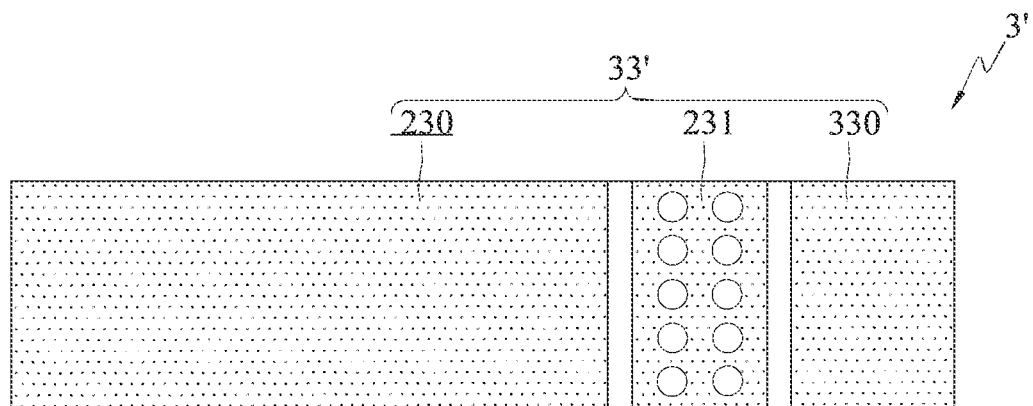
Figure 3E:
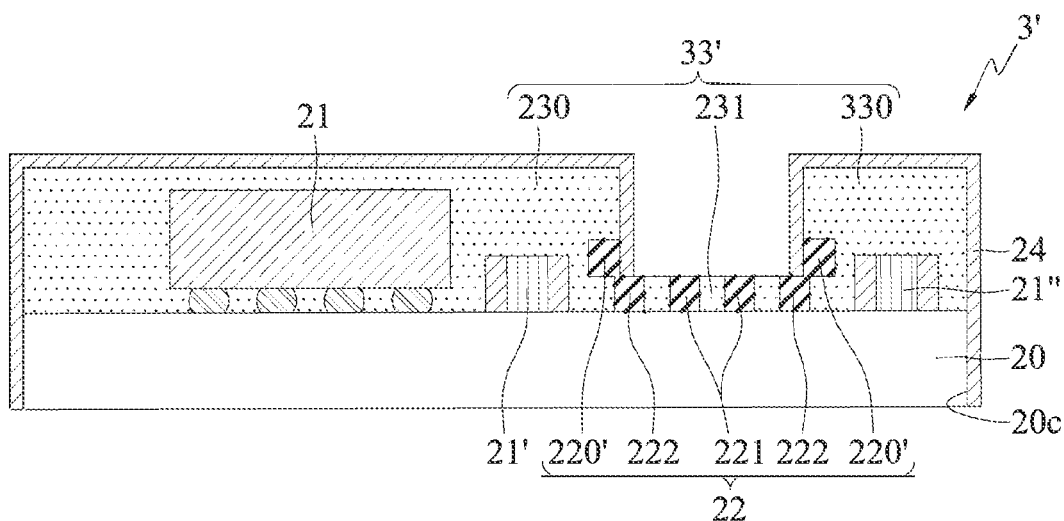

In addition, the position of the lead frame 22 can be adjusted according to the space requirement of electronic products. For example, as shown in an electronic package 3' of FIGS. 3E and 3E', the lead frame 22 is disposed away from the side surface 20c of the second area B of the carrier structure 20. Two first encapsulating portions 230, 330 of the encapsulant 33' are positioned on the two opposite sides of the carrier structure 20 to encapsulate the electronic elements 21, 21', 21", and the second encapsulating portion 231 is positioned between the two first encapsulating portions 230, 330. As such, the encapsulant 33' has a concave shape.

Figure 2D:
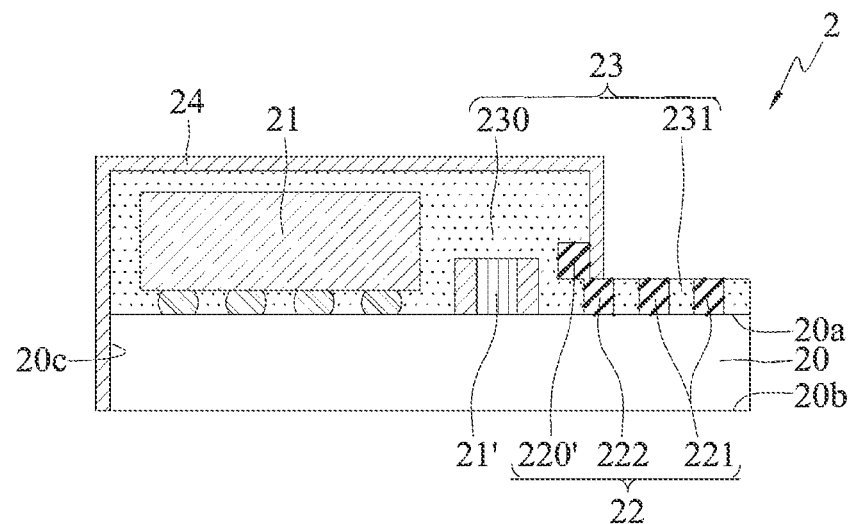
Figure 2D:
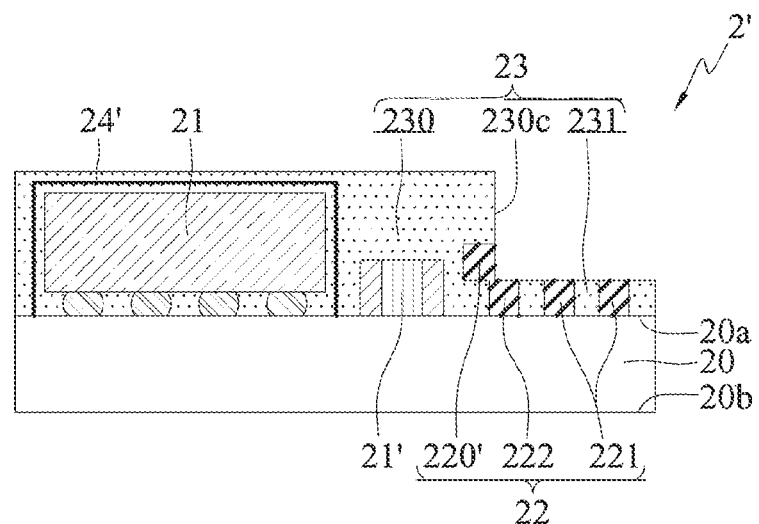

As shown in FIG. 2D, a shielding structure 24 is formed on the encapsulant 23 to cover the electronic elements 21, 21' so as to protect the electronic elements 21, 21' against external electromagnetic interference.

In an embodiment, if needed, the shielding structure 24 can cover the entire or a part (e.g., ½ or ⅓) of the surface of the first encapsulating portion 230 of the encapsulant 23, or even cover the entire or a part of the side surface 20c of the first area A of the carrier structure 20. For example, the shielding structure 24 can extend to the side surface 230c of the first encapsulating portion 230 so as to come into contact with the conductive block 220' and even the conductive wall 222. Since the conductive block 220' and the conductive wall 222 are exposed from the encapsulant 23, the shielding structure 24 can be electrically connected to the conductive block 220' and the conductive walls 222 so as to be connected to a grounding circuit of the carrier structure 20 through the conductive block 220' and the conductive walls 222, thereby achieving a shielding effect. It should be understood that the shielding structure 24 can also be in contact with a circuit layer of the side surface 20c of the first area A of the carrier structure 20 so as to be grounded for achieving the shielding effect.

Further, the shielding structure 24 can be formed on the encapsulant 23 by coating of a metal layer (e.g., copper), for example, through sputtering, vaporing, electroplating or electroless plating (chemical plating). Alternatively, the shielding structure 24 can be formed on the encapsulant 23 by covering a metal frame or metal cover, or by foiling. In another embodiment, as shown in an electronic package 2' of FIG. 2D', a shielding structure 24' such as a metal frame or metal cover is disposed on the carrier structure 20 to cover the electronic elements 21, 21' first and then the encapsulant 23 is formed to encapsulate the shielding structure 24'. It should be understood that various shielding methods can be used. For example, as shown in an electronic package 2" of FIG. 2D", at least one shielding portion 240 (e.g., of a column shape or a wall shape) is formed between the two electronic elements 21, 21' and electrically connected to the shielding structure 24.

Figure 2E:
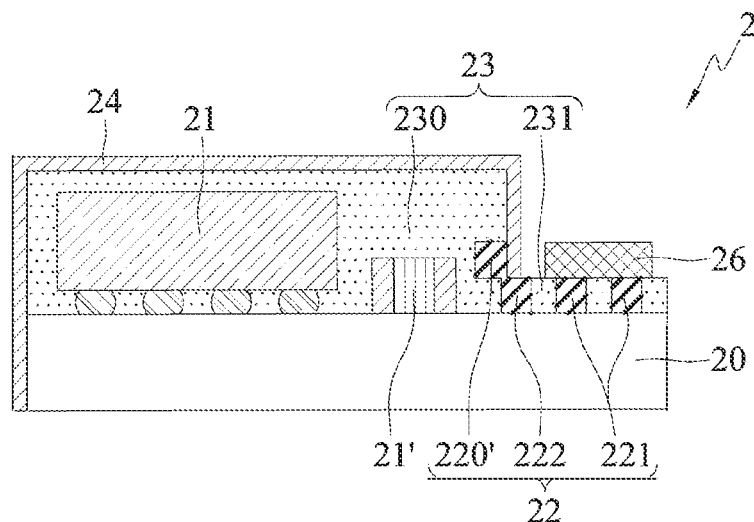
FIGS. 2E and 2E' are other aspects of FIG. 2D.
Figure 2E:
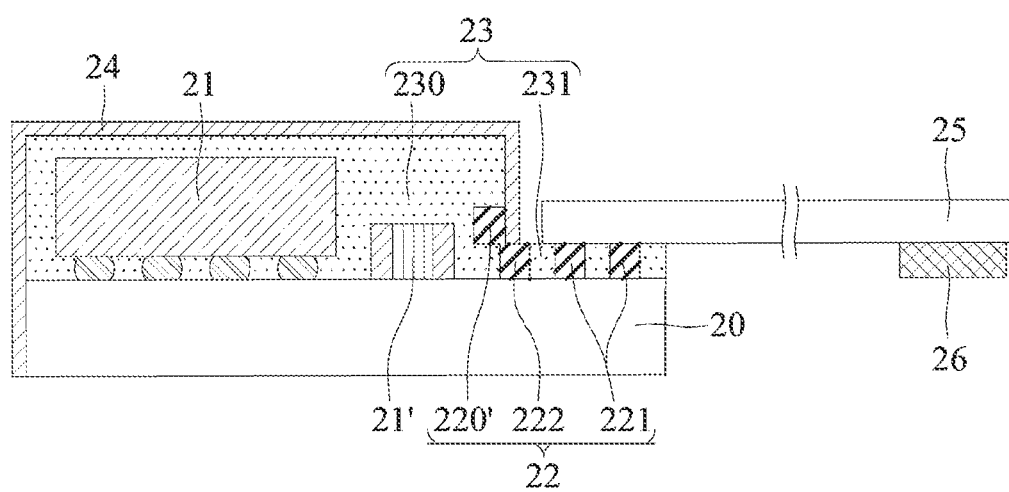

Furthermore, as shown in FIG. 2E, if needed, the electronic package 2, 2', 3, 3' can mount a connector 26 on the conductive posts 221 for connecting with a port of the mainboard of an electronic product. As such, the electronic package 2 is electrically connected to the mainboard and integrated into the electronic product. For example, the connector 26 can directly solder or use other manners to dispose on the conductive posts 221 so as to be electrically connected to the conductive posts 221.

Further, as shown in FIG. 2E', if needed, the electronic package 2, 2', 3, 3' can have an adapter 25 connected to the conductive posts 221, and the connector 26 is disposed on the adapter 25. For example, the adapter 25 is a soft or flexible circuit board, which can be bent as required and soldered onto the conductive posts 221 so as to be electrically connected to the conductive posts 221. One end of the adapter 25 is connected to the conductive posts 221 and the other end of the adapter 25 is connected to the connector 26. As shown in FIG. 2E", according to the internal space of the electronic product 9, the adapter 25 can be bent (to form an angle of about degrees or other degrees between the two sides thereof) so as to allow the connector 26 to be connected onto the port 900 of the mainboard 90 of the electronic product 9. As such, the electronic package 2 is electrically connected to the mainboard 90 and integrated to the electronic product 9. The electronic product 9 can have at least one supporting frame 91 for fastening the electronic package 2. Therefore, when the electronic product 9 has a limited internal space, the adapter 25 can be bent to facilitate the design of other components of the electronic product 9.

According to the present disclosure, the encapsulating material 23' is ground to form the encapsulant 23 having a notch. As such, the conductive posts 221 of the lead frame 22 are exposed from the second encapsulating portion 231 of the encapsulant 23 with a lower height so as to serve as contacts for electrically connecting with the connector 26 or for other purposes. Therefore, the connector 26 can be directly or indirectly integrated into the electronic package 2, 2', 3, 3', the antenna (circuit layer or antenna board 202) of the carrier structure 20, 20' can be electrically connected to the mainboard 90, and the carrier structure 20 can be disposed near the housing 9a of the electronic product 9 according to the requirement of signal strength. As such, compared with the prior art, there is no space limitation on the design of other components such as the mainboard 90 inside the electronic product 9 and the electronic product 9 can meet all functions as required.

Further, if the connector 26 is directly integrated onto the electronic package 2, 2', 3, 3', power provided by the mainboard 90 can be directly transmitted to the carrier structure 20, 20' without passing through other transmission path such as the adapter 25, thus avoiding electrical loss that otherwise would be generated when the power passes through the adapter 25. Consequently, the transmission speed is increased and the electrical performance is improved.

Furthermore, if the electronic package 2, 2', 3, 3' is positioned far from the mainboard 90, the package end can be connected to the connector 26 through a soft board or hard board type adapter 25 so as to increase the degree of position freedom of the electronic package 2, 2', 3, 3'. In addition, by directly soldering the adapter 25 to the package end, the required number of the connector 26 (the carrier structure 20, 20' does not need the connector) can be reduced, thus reducing the packaging cost.

Figure 4:
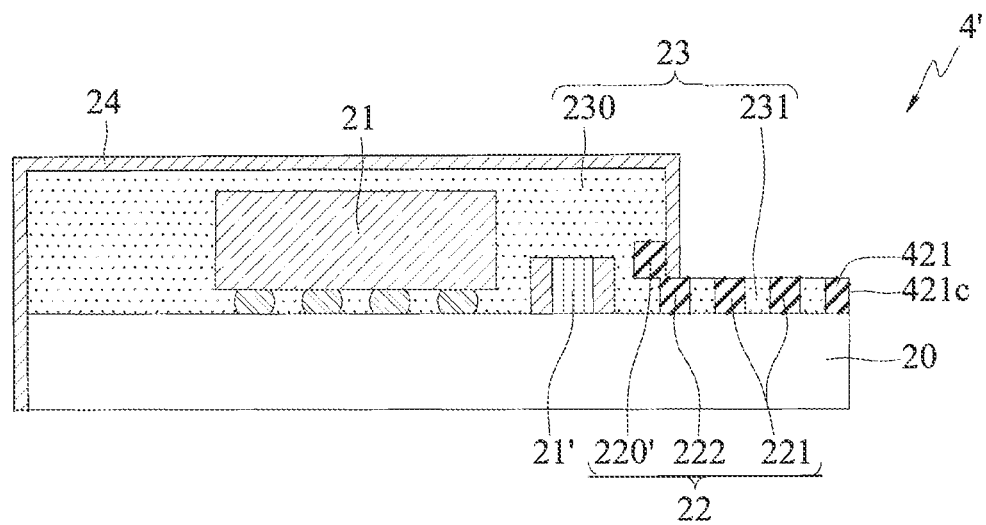
FIG. 4 is a schematic cross-sectional view of an electronic package according to another embodiment of the present disclosure.
Figure 4:
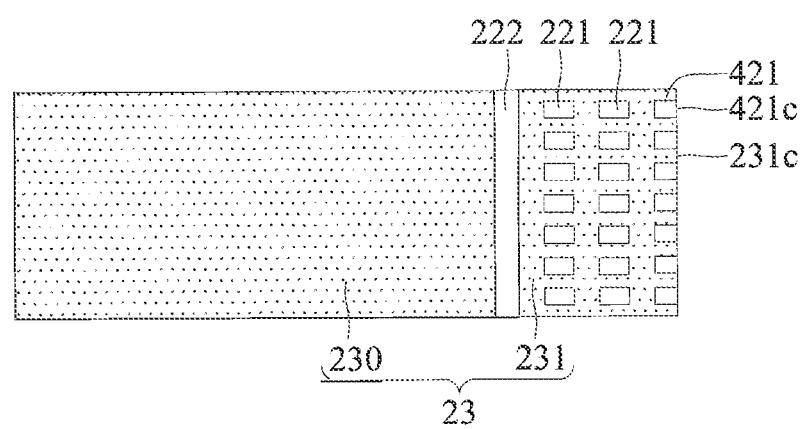

Further, as shown in FIGS. 4 and 4', if a peripheral surface 421c of the conductive post 421 is exposed from a side surface 231c of the second encapsulating portion 231 (for example, the peripheral surface 421c of the conductive post 421 is flush with the side surface 231c of the second encapsulating portion 231), the conductive post 421 can be grounded to achieve a shielding effect. In addition, the conductive post 421 can be electrically connected to other components of the system end (i.e., the internal components of the electronic product 9) for signal communication and/or grounding, thereby increasing the flexibility of configuration of the electronic package 2, 2', 3, 3' and other components of the system end (i.e., the internal components of the electronic product 9). That is, the side surface 231c of the second encapsulating portion 231 of the encapsulant 23 can serve as an external connection area.

The present disclosure further provides an electronic package 2, 2', 2", 3, 3', 4, which includes: a carrier structure 20, 20', at least one electronic elements 21, 21', a lead frame 22 and an encapsulant 23, 23', 33, 33'.

The carrier structure 20, 20' has an antenna function.

The electronic elements 21, 21' are disposed on and electrically connected to the carrier structure 20, 20'.

The lead frame 22 is disposed on the carrier structure 20, 20' and has a plurality of conductive posts 221, 421 separated from one another, wherein the plurality of conductive posts 221, 421 are electrically connected to the carrier structure 20, 20'.

The encapsulant 23, 23', 33, 33' is formed on the carrier structure 20, 20' for encapsulating the electronic elements 21, 21' and the lead frame 22, and the encapsulant 23, 23', 33, 33' is defined with a first encapsulating portion 230, 330 and a second encapsulating portion 231, 331 that are integrally formed with one another. The electronic elements 21, 21' are positioned in the first encapsulating portion 230, 330 and the plurality of conductive posts 221, 421 are positioned in the second encapsulating portion 231, 331, wherein the height H1 of the first encapsulating portion 230, 330 is greater than the height H2 of the second encapsulating portion 231, 331, and end surfaces of the plurality of conductive posts 221, 421 are exposed from a surface of the second encapsulating portion 231, 331 so as to be electrically connected to a connector 26.

In an embodiment, the carrier structure 20' comprises a circuit board 201 and an antenna board 202 stacked on one another.

In an embodiment, the electronic package 2, 2', 2", 3, 3', 4 further includes a shielding structure 24, 24' covering the electronic elements 21, 21'. For example, the shielding structure 24 is formed on portions of surfaces of the encapsulant 23, covers the electronic element 21 and is not in contact with the plurality of conductive posts 221, 421. Further, the lead frame 22 has at least one conductive wall 222 embedded in the encapsulant 23. The conductive wall 222 is separated from the plurality of conductive posts 221, 421, exposed from the second encapsulating portion 231 and connected to the shielding structure 24'. Alternatively, the lead frame 22 has at least one conductive block 220' embedded in the encapsulant 23. The conductive block 220' is separated from the conductive posts 221, 421, exposed from the first encapsulating portion 230 and connected to the shielding structure 24'.

In an embodiment, the connector 26 is disposed on the plurality of conductive posts 221.

In an embodiment, the connector 26 is electrically connected to the conductive posts 221 through an adapter 25 disposed on the plurality of conductive posts 221. For example, the adapter 25 is a flexible circuit board.

In an embodiment, the second encapsulating portion 231 is disposed on one side of the carrier structure 20.

In an embodiment, the second encapsulating portion 231 is disposed at a corner of the carrier structure 20.

In an embodiment, the encapsulant 33 has a plurality of second encapsulating portions 231, 331, and the first encapsulating portion 230 is positioned between two of the second encapsulating portions 231, 331.

In an embodiment, the encapsulant 33' has a plurality of first encapsulating portions 230, 330, and the second encapsulating portion 231 is positioned between two of the first encapsulating portions 230, 330.

Therefore, through the design of the encapsulant, the conductive posts are exposed from the second encapsulating portion to serve as contacts. Hence, the connector can be directly or indirectly integrated into the electronic package as required, the antenna of the carrier structure can be electrically connected to the mainboard of an electronic product with a high degree of freedom through the connector, and the carrier structure can be disposed near the housing of the electronic product according to the requirement of signal strength. Therefore, if the electronic product adopts the electronic package of the present disclosure, there is no space limitation on the design of other components, thus allowing the electronic product to meet all functions as required.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
a carrier structure having an antenna function;
an electronic element disposed on and electrically connected to the carrier structure;
a lead frame disposed on the carrier structure and having a plurality of conductive posts separated from one another, wherein the plurality of conductive posts are electrically connected to the carrier structure; and
an encapsulant disposed on the carrier structure for encapsulating the electronic element and the lead frame, wherein the encapsulant is defined with a first encapsulating portion and a second encapsulating portion that are integrally formed with one another, wherein the electronic element is positioned in the first encapsulating portion and the plurality of conductive posts are positioned in the second encapsulating portion, wherein a height of the first encapsulating portion is greater than a height of the second encapsulating portion, and wherein end surfaces of the plurality of conductive posts are exposed from a surface of the second encapsulating portion to electrically connect to a connector, and
wherein the lead frame further has at least one conductive wall embedded in the encapsulant, and wherein the at least one conductive wall is separated from the plurality of conductive posts and exposed from the second encapsulating portion.

2. The electronic package of claim 1, wherein the carrier structure comprises a circuit board and an antenna board stacked on one another.

3. The electronic package of claim 1, further comprising a shielding structure covering the electronic element.

4. The electronic package of claim 3, wherein the shielding structure is formed on portions of surfaces of the encapsulant, and covers the electronic element and is not in contact with the plurality of conductive posts.

5. The electronic package of claim 4, wherein the at least one conductive wall is connected to the shielding structure.

6. The electronic package of claim 4, wherein the lead frame further has at least one conductive block embedded in the encapsulant, and wherein the at least one conductive block is separated from the plurality of conductive posts, exposed from the first encapsulating portion and connected to the shielding structure.

7. The electronic package of claim 1, wherein the connector is disposed on the plurality of conductive posts.

8. The electronic package of claim 1, wherein the connector is electrically connected to the plurality of conductive posts through an adapter disposed on the plurality of conductive posts.

9. The electronic package of claim 8, wherein the adapter is a flexible circuit board.

10. The electronic package of claim 1, wherein the second encapsulating portion is disposed on one side of the carrier structure.

11. The electronic package of claim 1, wherein the second encapsulating portion is disposed at a corner of the carrier structure.

12. The electronic package of claim 1, wherein the encapsulant has a plurality of second encapsulating portions, and wherein the first encapsulating portion is positioned between two of the second encapsulating portions.

13. The electronic package of claim 1, wherein the encapsulant has a plurality of first encapsulating portions, and wherein the second encapsulating portion is positioned between two of the first encapsulating portions.

* * * * *